(12) United States Patent
Liang

(10) Patent No.: US 9,392,693 B2
(45) Date of Patent: Jul. 12, 2016

(54) METHOD FOR MANUFACTURING PRINTED CIRCUIT BOARD WITH SHALLOW SOLDER PAD

(71) Applicant: Ambit Microsystems (Zhongshan) LTD., Zhongshan (CN)

(72) Inventor: Ai-Hua Liang, Zhongshan (CN)

(73) Assignee: SHUNSIN TECHNOLOGY (ZHONG SHAN) LIMITED, Zhongshan (CN)

( * ) Notice: Subject to any disclaimer, the term of this patent is extended or adjusted under 35 U.S.C. 154(b) by 125 days.

(21) Appl. No.: 14/061,927

(22) Filed: Oct. 24, 2013

(65) Prior Publication Data

US 2014/0326485 A1    Nov. 6, 2014

(30) Foreign Application Priority Data

May 3, 2013    (CN) .......................... 2013 1 01609506

(51) Int. Cl.
*H05K 1/11*    (2006.01)
*H05K 1/02*    (2006.01)
*H05K 3/24*    (2006.01)
*H05K 3/34*    (2006.01)

(52) U.S. Cl.
CPC .............. *H05K 1/113* (2013.01); *H05K 1/0298* (2013.01); *H05K 3/244* (2013.01); *H05K 3/3452* (2013.01); *H05K 2201/09472* (2013.01); *Y10T 29/49155* (2015.01)

(58) Field of Classification Search
CPC ......... H05K 3/10; H05K 3/12; H05K 3/3952; H05K 1/0298; H05K 1/113; H05K 3/244; H05K 3/3452; Y10T 29/49155
See application file for complete search history.

(56) References Cited

U.S. PATENT DOCUMENTS 6,649,506 B2 * 11/2003 Hsu ..................... H01L 21/4853
257/737

FOREIGN PATENT DOCUMENTS

| CN | 100342526 C | * | 10/2007 |
| CN | 101236934 A | | 8/2008 |

* cited by examiner

*Primary Examiner* — Carl Arbes
(74) *Attorney, Agent, or Firm* — ScienBiziP, P.C.

(57) ABSTRACT

An exemplary printed circuit board includes a base, solder pads, and signal traces. The base includes outer surfaces. The signal traces having a first height relative to the base are formed on the outer surface of the base. The solder pads having a second height relative to the base are formed on the same surface having the signal traces. The first height of the signal trace is greater than the second height of the solder pad. Exemplary methods for manufacturing the printed circuit board are also provided.

3 Claims, 11 Drawing Sheets

METHOD FOR MANUFACTURING PRINTED CIRCUIT BOARD WITH SHALLOW SOLDER PAD

BACKGROUND

1. Technical Field

The present disclosure relates to printed circuit boards and methods for manufacturing printed circuit boards, and more particularly to a printed circuit board for protecting a metal layer of a solder pad from being damaged during stacking of a plurality of the printed circuit boards.

2. Description of Related Art

A conventional printed circuit board comprises a signal layer for transmitting electrical signals. A plurality of signal traces and a plurality of solder pads are formed on the signal layer. Typically, in order to enhance adhesion between the solder pads and electronic components, a metal layer is formed on the outside surface of each solder pad. However, the metal layers increase a height of the solder pads to be greater than a height of the signal traces, and so the metal layers are prone to damage when a plurality of the printed circuit boards are stacked together.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
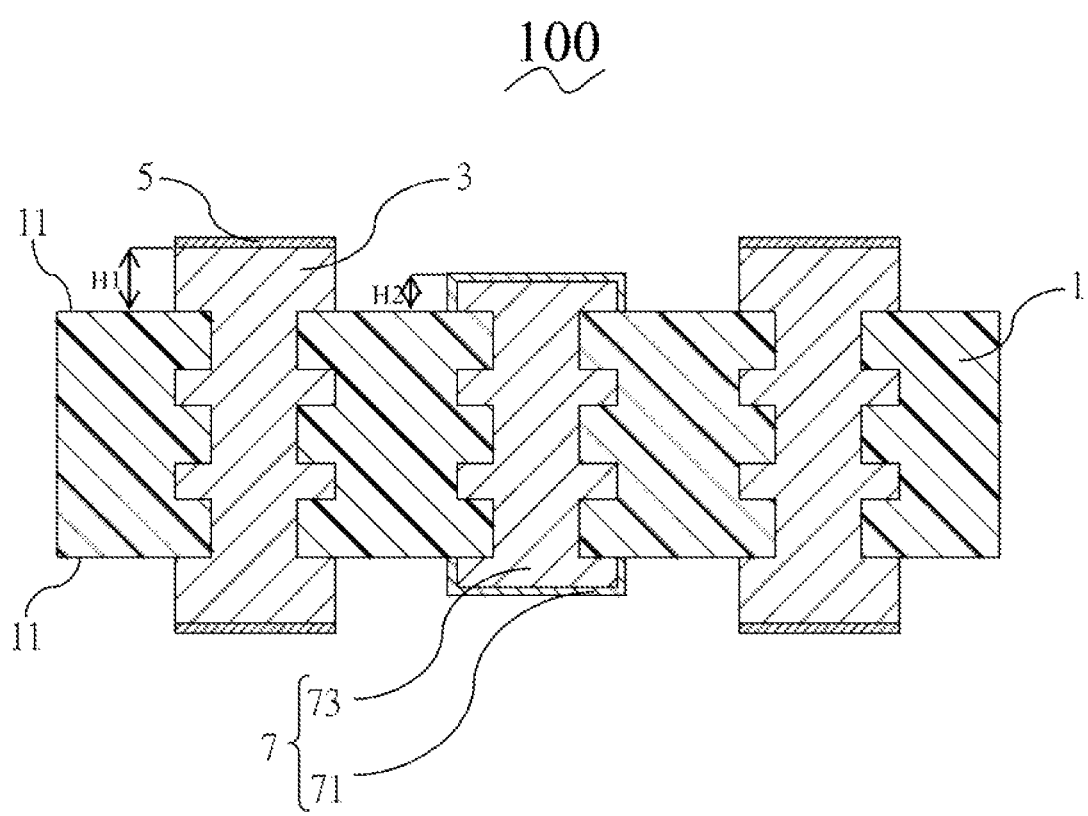
FIG. 1 is a cross-sectional view of a printed circuit board in accordance with an embodiment.

The disclosure is illustrated by way of example and not by way of limitation in the figures of the accompanying drawings in which like reference numerals indicate the same or similar elements. It should be noted that references to "an" or "one" embodiment in this disclosure are not necessarily to the same embodiment, and such references can mean "at least one."

FIG. 1 is a cross-sectional view of a printed circuit board 100 according to an exemplary embodiment. The printed circuit board 100 comprises a base 1. The base 1 comprises two major outer surfaces 11. A plurality of signal traces 3 and a plurality of solder pads 7 are formed on each of the outer surfaces 11.

The signal traces 3 are used to transmit signals. A solder mask layer 5 is formed on each of the signal traces 3. In the embodiment, the solder mask layer 5 is made of electrically insulating material.

Each solder pad 7 comprises a solder pad body 73 and a metal layer 71. The metal layer 71 is formed on a surface of the solder pad body 73 in order to enhance adhesion between the solder pad 7 and electronic components. The metal layer 71 can be made of gold or nickel, for example.

Each signal trace 3 has a first height H1 relative to the corresponding outer surface 11 of the base 1, and each solder pad 7 has a second height H2 relative to the corresponding outer surface 11. The first height H1 is greater than the second height H2. When a plurality of the printed circuit boards 100 are stacked together, the upper solder mask layers 5 of a lower one of the printed circuit boards 100 support the printed circuit boards 100 stacked upon the lower printed circuit board 100, because the signal traces 3 are higher than the solder pads 7. Therefore, the metal layers 71 of the solder pads 7 of the lower printed circuit board 100 are protected from being damaged when the printed circuit boards 100 are stacked together.

Figure 2:
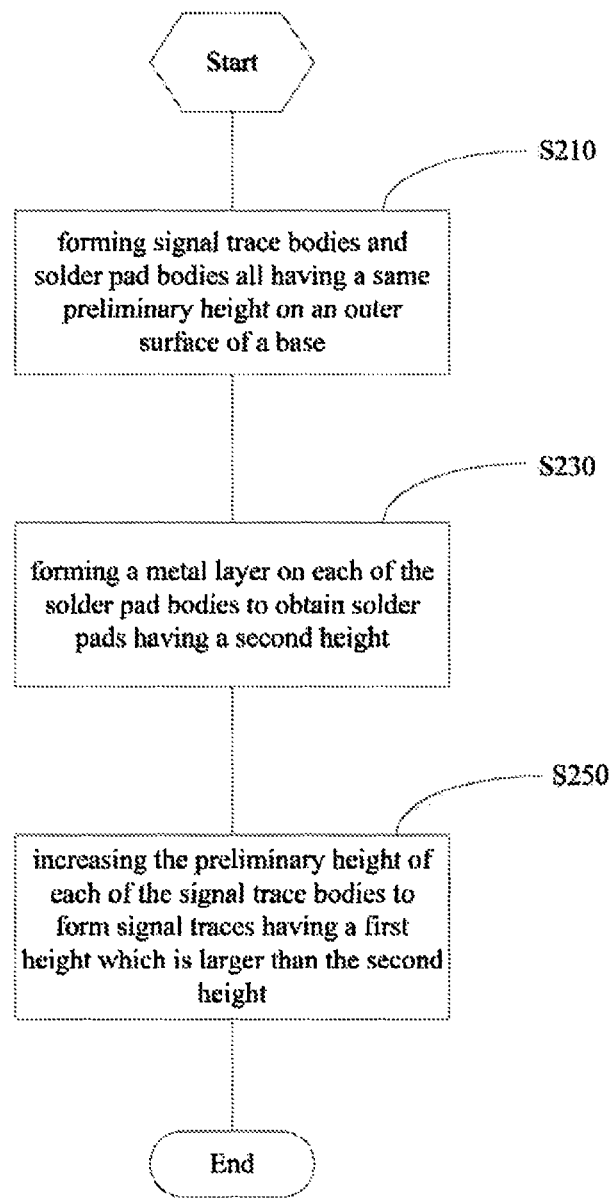
FIG. 2 is a flow chart of a first exemplary method for manufacturing the printed circuit board of FIG. 1.

Referring to FIG. 2, a first exemplary method for manufacturing the printed circuit board 100 comprises the following steps.

Figure 3:
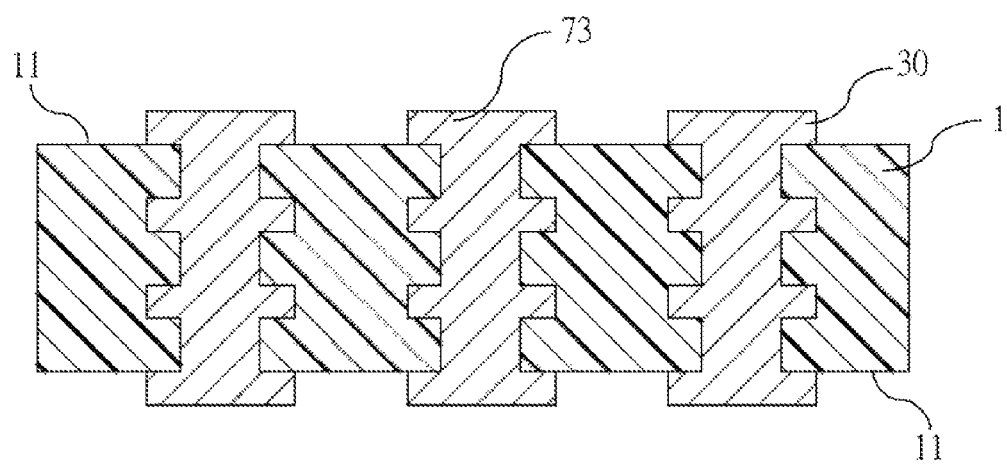
FIG. 3 is a cross-sectional view of a printed circuit board preform, including a base having signal traces and solder pad bodies, according to the first exemplary method.

In step S210, a plurality of signal trace bodies 30 and the plurality of solder pad bodies 73, all having a same preliminary height, are formed on the base 1 (see FIG. 3). In detail, each of the outer surfaces 11 of the base 1 has a layer of copper foil formed thereon as a conductive layer. A dry-film is coated on areas of the copper foil that are required to transmit electrical signals, in order to protect these areas against subsequent etching processes. Areas of the copper foil not required to transmit electrical signals are removed by etching. Thereby, the signal trace bodies 30 and the solder pad bodies 73 are formed on the base 1 by the etching process.

In another embodiment, each of the outer surfaces 11 of the base 1 does not have a layer of copper foil formed thereon. Instead, a dry-film is coated on areas of the outer surfaces 11 of the base 1 that are not required to transmit electrical signals, thereby leaving exposed areas of the outer surfaces 11 of the base 1 that are required to transmit electrical signals. The signal trace bodies 30 and the solder pad bodies 73 are formed by electroplating on the exposed areas of the outer surfaces 11 of the base 1. Thereby, the signal trace bodies 30 and the solder pad bodies 73 are formed on the base 1 by electroplating. After the signal trace bodies 30 and the solder pad bodies 73 are formed, the dry-film is removed from the outer surfaces 11 of the base 1.

Figure 4:
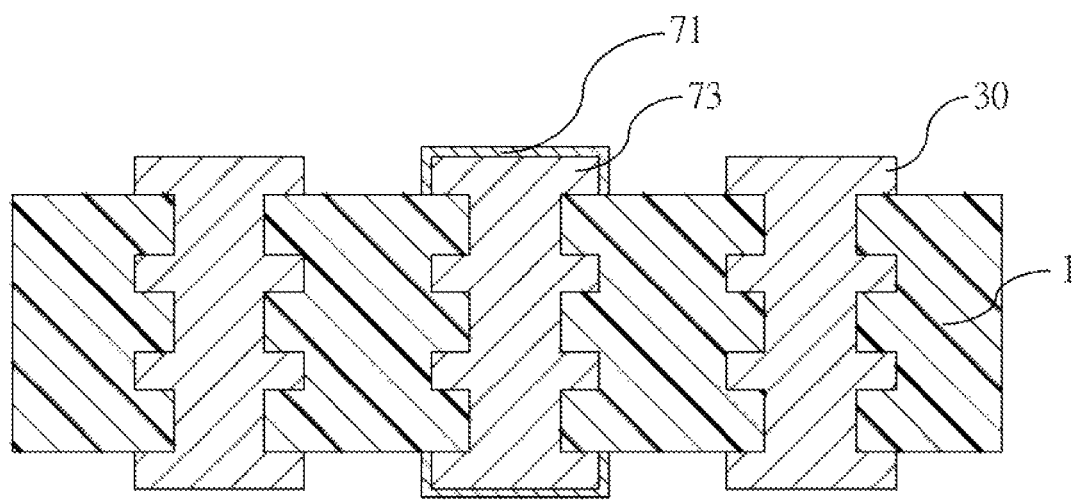
FIG. 4 is similar to FIG. 3, but showing metal layers formed on the solder pad bodies.

In step S230, a metal layer 71 is formed on each of the solder pad bodies 73 to obtain the solder pads 7 having a second height H2 (see FIGS. 1 and 4). The second height H2 is greater than the preliminary height. The metal layers 71 are formed on the solder pad bodies 73 by electroplating.

Figure 5:
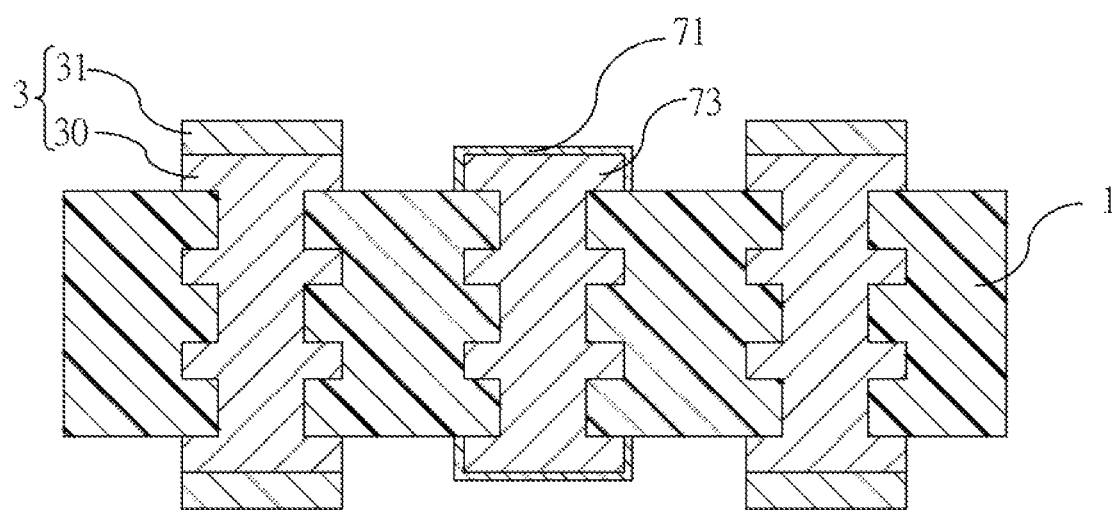
FIG. 5 is similar to FIG. 4, but showing copper layers formed on the signal traces.
Figure 6:
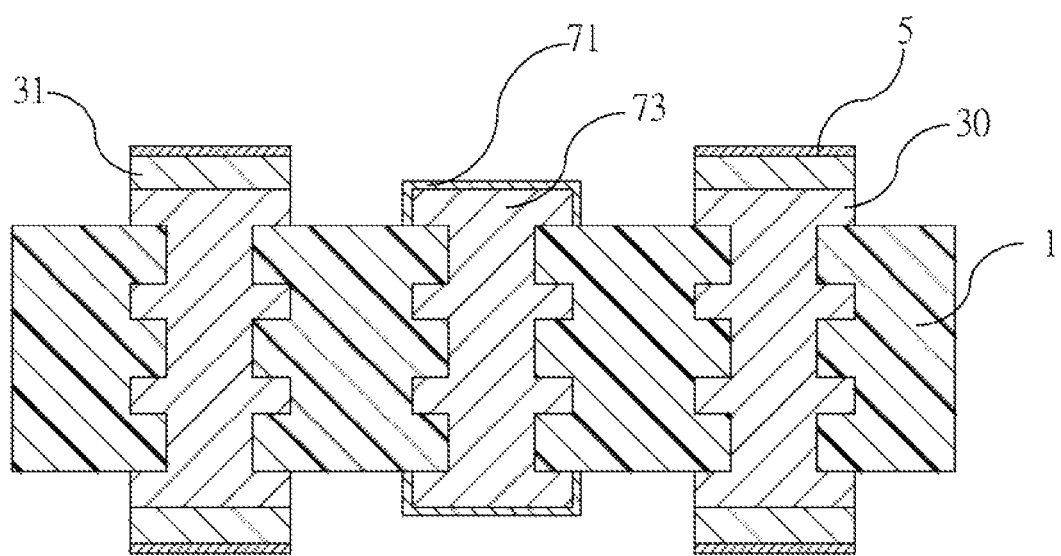
FIG. 6 is similar to FIG. 5, but showing solder mask layers formed on the copper layers of the signal traces.

In step S250, the preliminary height of the signal trace bodies 30 is increased, to form the signal traces 3 have a first height H1 which is greater than the second height H2 of the solder pads 7 (see FIGS. 1 and 5). Specifically, the preliminary height of the signal trace bodies 30 is increased by electroplating copper layers 31 on the signal trace bodies 30. In detail, a dry-film is coated on the base 1 and the solder pads 7, so that only the signal trace bodies 30 are exposed. The copper layers 31 are formed on the signal trace bodies 30 by way of electroplating until the combined height of the signal trace bodies 30 and copper layers 31 reaches the first height H1. Subsequently, as shown in FIG. 6, solder mask layers 5 are coated on the copper layers 31 to electrically insulate the signal traces 3. That is, the solder mask layers 5 are made of electrically insulating material. Then the dry-film is removed.

Figure 7:
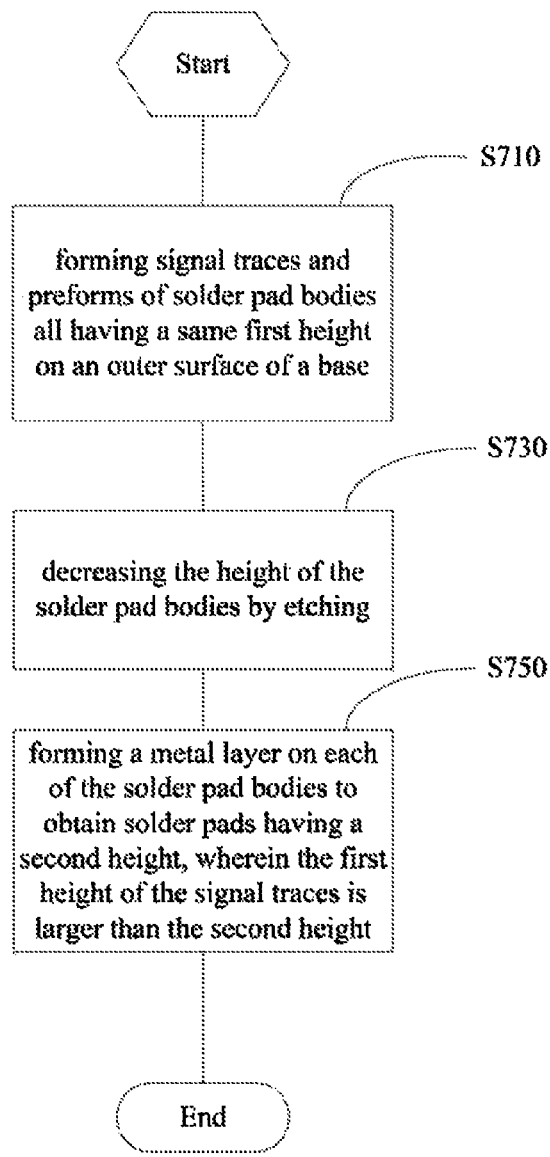
FIG. 7 is a flow chart of a second exemplary method for manufacturing the printed circuit board of FIG. 1.

FIG. 7 is a flow chart of a second exemplary method for manufacturing the printed circuit board 100.

Figure 8:
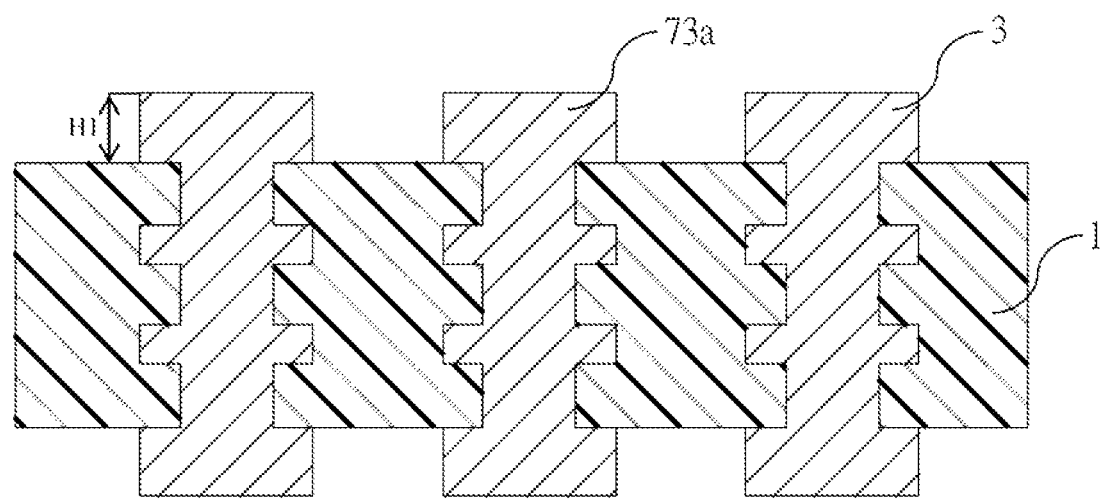
FIG. 8 is a cross-sectional view of a printed circuit board preform, including a base having signal traces and solder pad body preforms, according to the second exemplary method.

Step S710 of the second exemplary method is substantially the same as step S210 of the first exemplary method. The plurality of signal traces 3 and a plurality of solder pad body preforms 73a, all having a same height, are formed on the base 1. In the embodiment, the height is a first height H1 (see FIGS. 1 and 8). The first height H1 of the solder pad body preforms 73a is a preliminary height thereof.

Figure 9:
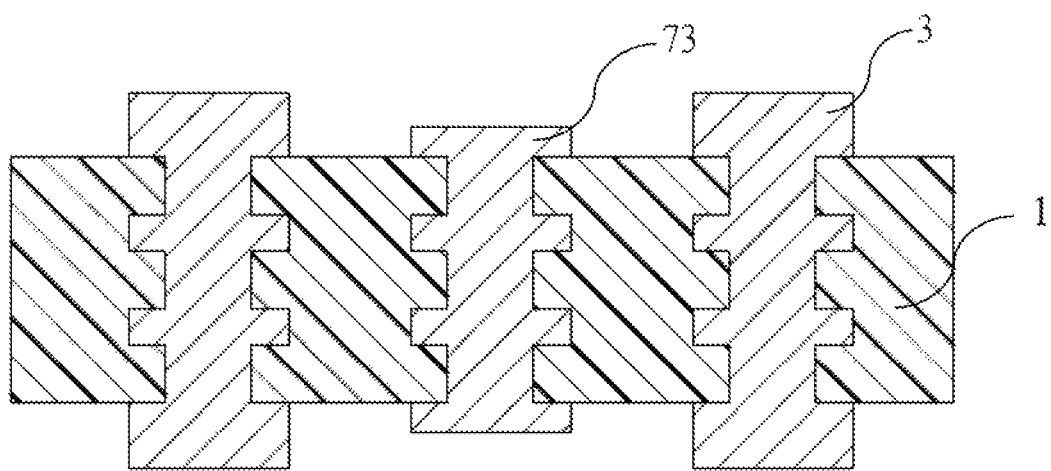
FIG. 9 is similar to FIG. 8, but showing the solder pad bodies etched to have a desired height.

In step S730, the preliminary height of the solder pad body preforms 73a is decreased by etching. In detail, in this embodiment, a dry-film is coated on the base 1 and the signal traces 3, so that only the solder pad body preforms 73a are exposed. Then the solder pad body preforms 73a are etched to a desired height, thus forming the solder pad bodies 73 (see FIG. 9).

Figure 10:
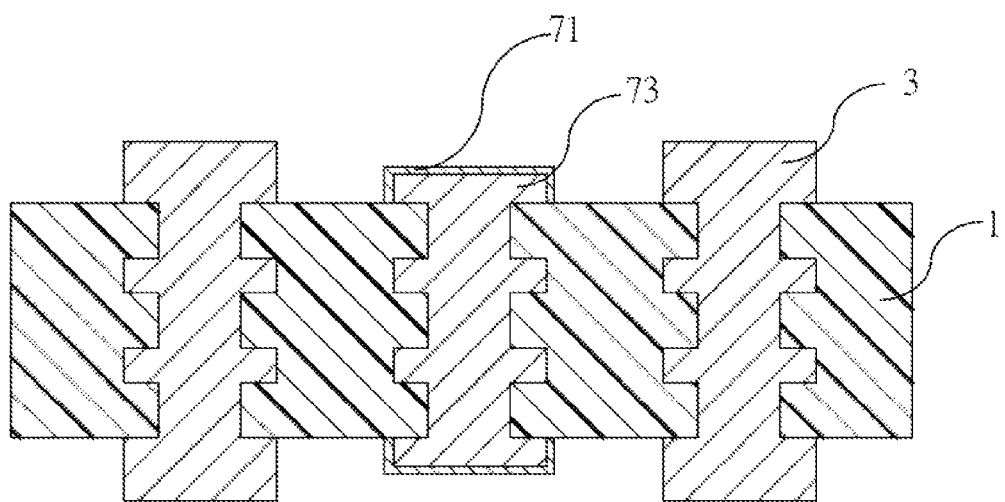
FIG. 10 is similar to FIG. 9, but showing metal layers formed on the solder pad bodies.
Figure 11:
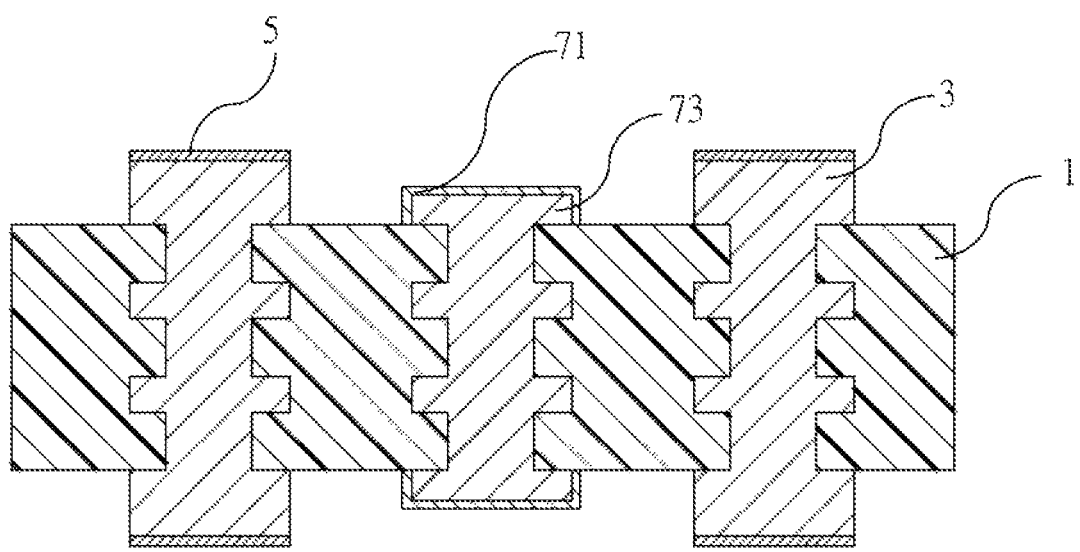
FIG. 11 is similar to FIG. 10, but showing solder mask layers formed on the signal traces.

In step S750, a metal layer 71 is formed on each of the solder pad bodies 73 to obtain the solder pads 7 having a second height H2 (see FIGS. 1 and 10). The metal layers 71 are formed on the solder pad bodies 73 by electroplating. The first height H1 is greater than the second height H2. Subsequently, a dry-film is coated on the base 1 and the solder pads 7, so that only the signal traces 3 are exposed. Then, as shown in FIG. 11, solder mask layers 5 are coated on the signal traces 3 to electrically insulate the signal traces 3. That is, the solder mask layers 5 are made of electrically insulating material. Then the dry-film is removed.

Each of the first and second exemplary methods described above forms the signal traces 3 having the height H1 greater than the height H2 of the solder pads 7. Therefore, the metal layers 71 of the solder pads 7 are protected from damage when a plurality of the printed circuit boards 100 are stacked together. In addition, the exemplary methods are relatively easy, and are apt to reduce a rejection rate in mass production of the printed circuit boards 100.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A method for manufacturing a printed circuit board, the method comprising:
    forming at least one signal trace body and at least one solder pad body on an outer surface of a base, the at least one signal trace body and the at least one solder pad body having a same preliminary height;
    forming a metal layer on the at least one solder pad body to obtain at least one solder pad, the at least one solder pad having a second height relative to the outer surface of the base; and
    forming a older mask layer only on the at least one signal trace body without a solder mask layer being formed on the base and the solder pad body to increase the preliminary height of the at least one signal trace body and thereby form at least one signal trace, the at least one signal trace having a first height relative to the outer surface of the base, and the first height being greater than the second height.

2. The method of claim 1, wherein forming at least one signal trace body and at least one solder pad body on an outer surface of a base comprises:
    coating a dry-film layer on the base; and
    forming at least one signal trace body and at least one solder pad body on the base by a selected one of an etching process and electroplating.

3. The method of claim 1, wherein increasing the preliminary height of the at least one signal trace body and thereby forming the at least one signal trace having the first height comprises:
    coating a dry-film layer on the base and the at least one solder pad to expose the at least one signal trace body only; and
    forming a copper layer on the at least one signal trace body by electroplating until the at least one signal trace body reaches the first height.

* * * * *